(12) United States Patent
Geiger

(10) Patent No.: US 11,060,349 B2
(45) Date of Patent: Jul. 13, 2021

(54) WINDOW SHADE ASSEMBLY

(71) Applicant: GeigTech East Bay LLC, Charleston, SC (US)

(72) Inventor: James Geiger, Charleston, SC (US)

(73) Assignee: GeigTech East Bay LLC, Charleston, SC (US)

( * ) Notice: Subject to any disclaimer, the term of this patent is extended or adjusted under 35 U.S.C. 154(b) by 0 days.

(21) Appl. No.: 16/510,440

(22) Filed: Jul. 12, 2019

(65) Prior Publication Data
US 2020/0018118 A1   Jan. 16, 2020

Related U.S. Application Data

(60) Provisional application No. 62/697,757, filed on Jul. 13, 2018.

(51) Int. Cl.
*E06B 9/44* (2006.01)
*E06B 9/72* (2006.01)
*H02S 30/20* (2014.01)
*H02S 40/38* (2014.01)
*A47H 1/13* (2006.01)
*E06B 9/24* (2006.01)

(52) U.S. Cl.
CPC ............ *E06B 9/44* (2013.01); *A47H 1/13* (2013.01); *E06B 9/72* (2013.01); *H02S 30/20* (2014.12); *H02S 40/38* (2014.12); *E06B 2009/2476* (2013.01)

(58) Field of Classification Search
CPC .... H02S 10/20; H02S 40/38; H02S 20/00–32; H02S 30/00–20; E06B 9/72; E06B 2009/2476
See application file for complete search history.

(56) References Cited

U.S. PATENT DOCUMENTS

| | | |
|---|---|---|
| 4,137,098 A | 1/1979 | Field |
| 4,604,990 A | 8/1986 | Nikkel |
| 5,760,558 A | 6/1998 | Popat |

(Continued)

FOREIGN PATENT DOCUMENTS

| | | |
|---|---|---|
| CN | 202706840 | 1/2013 |
| CN | 103321553 | 9/2013 |

(Continued)

*Primary Examiner* — Eric R Smith
(74) *Attorney, Agent, or Firm* — Kim and Lahey Law Firm, LLC; Seann Lahey

(57) ABSTRACT

A window shade assembly including a shade tube configured to support a shade and extending longitudinally, a mounting bracket, a motor assembly extending within the shade tube and coupled to the shade tube, and a battery pack extending within the shade tube. A central axis extends longitudinally through the center of the shade tube. The motor assembly is configured to rotate the shade tube relative to the mounting bracket about the central axis to at least one of raise and lower the shade. The battery pack includes a battery housing and at least one battery. The battery housing couples the motor assembly with the mounting bracket and defines at least one battery bay. The at least one battery is carried within the at least one battery bay. The at least one battery is configured to store and provide energy to the motor assembly for rotating the shade tube.

29 Claims, 6 Drawing Sheets

(56) References Cited

U.S. PATENT DOCUMENTS

| | | |
|---|---|---|
| 8,528,621 B2 | 9/2013 | Murphy |
| 8,748,729 B2 | 6/2014 | Nocito |
| 9,133,662 B2 | 9/2015 | Nocito |
| 9,237,821 B2 | 1/2016 | Geiger |
| D776,456 S | 1/2017 | Geiger |
| 9,695,635 B2 | 7/2017 | Taylor |
| 9,789,949 B2 | 10/2017 | Hontz |
| 9,790,739 B2 | 10/2017 | Colson |
| 9,840,868 B2 | 12/2017 | Geiger |
| 9,988,839 B2 | 6/2018 | Geiger |
| 10,256,589 B2 | 4/2019 | Russikoff |
| 10,273,747 B2 | 4/2019 | Hall |
| 10,294,717 B2 | 5/2019 | Geiger |
| 10,415,307 B2 | 9/2019 | Geiger |
| 10,718,159 B2 | 7/2020 | Colson |
| 10,738,530 B2 | 8/2020 | Campagna |
| 2004/0045683 A1 | 3/2004 | Carrillo |
| 2004/0055633 A1 | 3/2004 | Lambey |
| 2005/0254234 A1* | 11/2005 | Wang ............ F21V 23/0414 362/184 |
| 2006/0000558 A1 | 1/2006 | Fennell |
| 2009/0255568 A1 | 10/2009 | Morgan |
| 2010/0051100 A1 | 3/2010 | Nocito |
| 2011/0005694 A1 | 1/2011 | Ng |
| 2012/0073624 A1 | 3/2012 | Nocito |
| 2013/0284234 A1 | 10/2013 | Funayama |
| 2014/0027069 A1 | 1/2014 | Oppizzi |
| 2014/0028242 A1 | 1/2014 | Akin |
| 2014/0224434 A1 | 8/2014 | Gross |
| 2015/0136941 A1 | 5/2015 | Geiger |
| 2018/0058143 A1* | 3/2018 | Selogy ............ E06B 9/70 |
| 2018/0112463 A1 | 4/2018 | Derk, Jr. |
| 2018/0310745 A1 | 11/2018 | Giri |
| 2019/0032404 A1* | 1/2019 | Chacon ............ H01M 10/46 |
| 2019/0162022 A1 | 5/2019 | Geiger |
| 2020/0018118 A1 | 1/2020 | Geiger |
| 2020/0032583 A1 | 1/2020 | Hebeisen |
| 2020/0131849 A1 | 4/2020 | Campagna |
| 2020/0185965 A1 | 6/2020 | Poirier |
| 2020/0263494 A1 | 8/2020 | Hebeisen |

FOREIGN PATENT DOCUMENTS

| | | | |
|---|---|---|---|
| EP | 3219898 A1 * | 9/2017 | ............ E06B 9/72 |
| GB | 2455753 | 6/2009 | |
| JP | 2004012818 | 1/2004 | |
| JP | 2010021501 | 1/2010 | |
| JP | 2011179193 A | 9/2011 | |

* cited by examiner

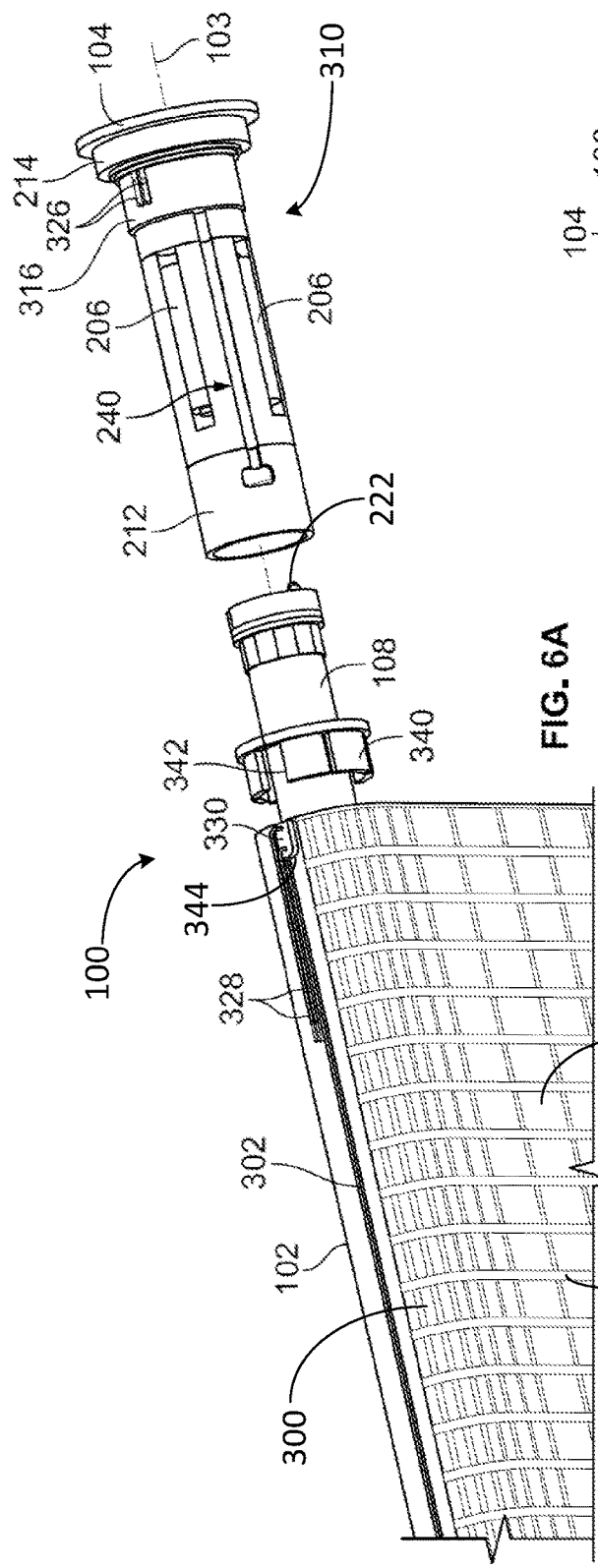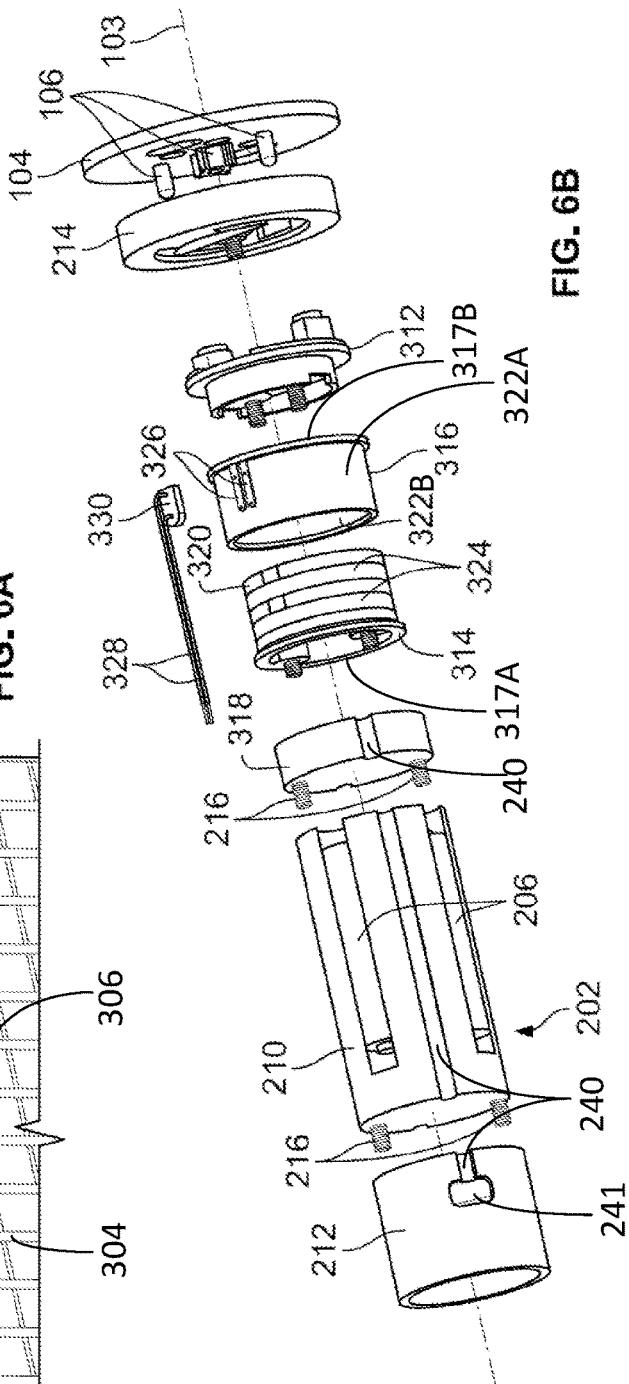

WINDOW SHADE ASSEMBLY

BACKGROUND OF THE INVENTION

1) Field of the Invention

The present invention relates generally to the field of window shades. In particular, the present application relates to battery powered roller type window shades.

2) Description of Related Art

Roller window shade assemblies typically include a shade tube, a piece of shade fabric rolled around the shade tube, and brackets that rotatably couple the shade tube to a wall or ceiling. Motors are used to rotate the shade tube, thereby raising and lowering the shade fabric. The motors are conventionally positioned within the shade tube in order to reduce the overall size of the shade assembly. In some arrangements, wires are run to the motors to provide electrical power from the power grid to the motors. However, in some situations, extending wires to the motors can be difficult or unsightly. By way of example, buildings with solid concrete walls prohibit running wires through the walls, requiring the wires to be visually exposed. Alternatively, some shade assemblies include batteries that power the motors. For example, batteries can be positioned outside of the shade tube and connected to the motor with a wire. However, this arrangement requires additional space for the batteries outside the shade tube and can leave the batteries visually exposed. In another example, batteries can be positioned inside of a motor that is inserted into a shade tube.

Accordingly, it is an object of the present invention to provide a battery powered window shade assembly.

It is a further object of the present invention to provide a battery powered window shade assembly with the batteries carried and arranged in the shade tube independent of the motor assemblies.

It is a further object of the present invention to provide a battery powered window shade assembly wherein the batteries can be charged from an external power source without unsightly external wiring.

SUMMARY OF THE INVENTION

The above objectives are accomplished according to the present invention by providing, in one exemplary embodiment, a window shade assembly comprising a shade tube configured to support a shade and extending longitudinally, wherein a central axis extends longitudinally through the center of said shade tube; a mounting bracket; a motor assembly extending within said shade tube, coupled to said shade tube, and configured to rotate said shade tube relative to said mounting bracket about said central axis to at least one of raise and lower said shade; and a battery pack extending within said shade tube, the battery pack comprising: a battery housing coupling said motor assembly with said mounting bracket, and wherein said battery housing including at least one battery bay; and at least one battery carried within said at least one battery bay, wherein said at least one battery is configured to store energy, and wherein said at least one battery is configured to provide the energy to said motor assembly to power said motor assembly for rotating said shade tube to raise and lower said shade.

In a further advantageous embodiment, said at least one battery bay is centered and extends longitudinally along said central axis within said shade tube.

In a further advantageous embodiment, said at least one battery bay includes a series of batteries arranged inline longitudinally end to end in a single row centered along said central axis such that the positive terminal of one battery engages the negative terminal of an adjacent battery.

In a further advantageous embodiment, said at least one battery bay is offset from said central axis within said shade tube.

In a further advantageous embodiment, said battery housing includes a plurality of battery bays arrayed around said central axis of said shade tube and extending longitudinally parallel to said central axis for receiving said at least one battery in each of said battery bays.

In a further advantageous embodiment, said plurality of battery bays have a circular cross-section transverse to said central axis.

In a further advantageous embodiment, said plurality of battery bays are positioned in a circular pattern such that a central axis of each battery bay is located along a common circle concentric to said central axis of said shade tube.

In a further advantageous embodiment, said plurality of battery bays are arranged in opposing laterally offset locations around said central axis of said shade tube so that said battery bays extend longitudinally along the same portion of length within said shade tube.

In a further advantageous embodiment, said battery housing includes a first portion defining a battery support, wherein said at least one battery bay is included in at least said battery support.

In a further advantageous embodiment, said battery housing includes a second portion defining a motor adapter, wherein said motor adaptor is coupled to a first end of said battery support and engages said motor assembly.

In a further advantageous embodiment, said motor adaptor includes a cavity defining a receiver that receives an end portion of said motor assembly in a fixed arrangement so that said end portion torques against said motor adaptor to facilitate rotation of said shade tube by said motor assembly, and wherein said motor adaptor remains stationary during rotation of said shade tube.

In a further advantageous embodiment, said battery housing includes a third portion defining a mounting bracket adapter, wherein said mounting bracket adapter is coupled to a second end of said battery support opposite from said motor adapter and engages said mounting bracket.

In a further advantageous embodiment, said mounting bracket adapter includes at least one recess receiving at least one complementary projection from said mounting bracket to resist rotation between said mounting bracket adapter and said mounting bracket, wherein said battery housing remains stationary within said shade tube when said motor assembly is rotating said shade tube.

In a further advantageous embodiment, said mounting bracket adapter is releasably coupled to said second end of said battery support, and said at least one battery bay extends to said mounting bracket adapter such that removal of said mounting bracket adapter from said battery support provides access to said at least one battery bay to insert and remove said at least one battery dispose in said at least one battery bay.

In a further advantageous embodiment, an idler roller is carried by said mounting bracket adapter engaging an interior surface of said shade tube so that said idler roller rotates with and supports said shade tube around said mounting bracket adapter which is non-rotatably connected to said mounting bracket.

In a further advantageous embodiment, a charge port is disposed in said mounting bracket adapter configured to interface with a charging cord of an external power supply, wherein said charge port is electrically coupled to said at least one battery such that electrical power is supplied from said external power supply through said charging port to charge said at least one battery.

In a further advantageous embodiment, a wire slot is disposed in at least one of said battery support, said motor adapter and said mounting bracket adapter for channeling wiring to electrically connect said at least one battery to said motor assembly.

In a further advantageous embodiment, said wire slot extends from said mounting bracket adapter along said battery support and said motor adapter to a wire port disposed in said motor adapter for channeling wiring to electrically connect said at least one battery to said motor assembly.

In a further advantageous embodiment, said battery housing includes a slip ring assembly coupled to an interior surface of said shade tube for rotating with said shade tube, wherein said shade includes a photovoltaic element configured to generate electrical energy in response to receiving light, and wherein said slip ring assembly provides an electrical coupling from said photovoltaic element to said at least one battery in said battery housing while rotating with said shade tube.

The above objectives are further accomplished according to the present invention by providing, in one exemplary embodiment, a window shade assembly comprising a shade tube configured to support a shade and extending longitudinally, wherein a central axis extends longitudinally through the center of said shade tube; a photovoltaic element disposed on said shade configured to generate electrical energy in response to receiving light; a mounting bracket for supporting said shade tube on a mounting surface; a motor assembly extending within said shade tube, coupled to said shade tube, and configured to rotate said shade tube about said central axis to at least one of raise and lower said shade; and a battery housing coupling said motor assembly with said mounting bracket so that said battery housing is stationary within said shade tube during rotation of said shade tube; at least one battery bay disposed in said battery housing carrying at least one battery, wherein said at least one battery is electrically coupled to said motor assembly; and, a slip ring assembly included in said battery housing, wherein said slip ring assembly couples with an interior side of said shade tube for rotating with said shade tube, and wherein said slip ring assembly provides an electrical coupling from said photovoltaic element to said at least one battery in said battery housing while rotating with said shade tube.

In a further advantageous embodiment, said slip ring assembly includes a fixed sleeve carried in a fixed position in said battery housing so that said fixed sleeve remains stationary during rotation of said shade tube, wherein said fixed sleeve is annular with a cylindrical outer surface and includes at least one first electrical contact extending annularly around said cylindrical outer surface.

In a further advantageous embodiment, said slip ring assembly includes a bearing sleeve rotatably carried on said fixed sleeve that couples to said interior side of said shade tube and rotates with said shade tube, wherein said bearing sleeve is annular with a cylindrical inner surface and includes at least one second electrical contact extending annularly along said cylindrical inner surface, and wherein said at least one second electrical contact maintains engagement with said at least one first electrical contact through an entire rotation of said shade tube.

In a further advantageous embodiment, said at least one first electrical contact is electrically coupled to at least one of said motor assembly and said at least one battery.

In a further advantageous embodiment, said at least one second electrical contact is electrically coupled to said photovoltaic element.

In a further advantageous embodiment, an annular bushing receives said bearing sleeve, wherein said annular bushing engages said interior surface of shade tube and an exterior surface of said bearing sleeve to resist radial movement of said bearing sleeve within said shade tube.

In a further advantageous embodiment, a bracket is coupled to said fixed sleeve in a fixed arrangement, wherein said bracket includes a first flange and said fixed sleeve includes a second flange; wherein said bearing sleeve is disposed between said first and second flanges to resist movement of said bearing sleeve along said central axis.

In a further advantageous embodiment, a controller is electrically coupled to said motor assembly, said at least one battery, and said photovoltaic element; wherein said controller is configurable to monitor a charge level of said at least one battery and to power said motor assembly to automatically lower said shade in response to said charge level falling below a threshold level, and to power said motor assembly to automatically raise said shade in response to said charge level exceeding said threshold level.

The above objectives are further accomplished according to the present invention by providing, in one exemplary embodiment, a window shade assembly comprising a shade tube configured to support a shade and extending longitudinally, wherein a central axis extends longitudinally through the center of said shade tube; a motor assembly extending within said shade tube, coupled to said shade tube, and configured to rotate said shade tube about said central axis to at least one of raise and lower said shade; a battery housing coupled to said motor assembly so that said battery housing is stationary within said shade tube during rotation of said shade tube; at least one battery bay disposed in said battery housing carrying at least one battery, wherein said at least one battery is electrically coupled to said motor assembly; and, a slip ring assembly rotatably coupling said shade tube to said battery housing so that said shade tube rotates around said battery housing, wherein said slip ring assembly provides an electrical coupling from a power source to at least one of said motor assembly and said at least one battery.

In a further advantageous embodiment, said power source comprises a photovoltaic element disposed on said shade configured to generate electrical energy in response to receiving light.

In a further advantageous embodiment, said battery housing is coupled in a fixed arrangement to a mounting bracket disposed external to said shade tube, wherein said mounting bracket is secured to a mounting surface so that said battery housing is fixed in a stationary arrangement within said shade tube and said motor assembly torques against said battery housing for rotating said shade tube.

In a further advantageous embodiment, said battery housing includes a first portion defining a battery support, wherein said at least one battery bay is included in at least said battery support.

In a further advantageous embodiment, said battery housing includes a second portion defining a motor adapter, wherein said motor adaptor is coupled to a first end of said battery support and engages said motor assembly.

In a further advantageous embodiment, said battery housing includes a third portion defining a mounting bracket adapter, wherein said mounting bracket adapter is coupled to a second end of said battery support opposite from said motor adapter and further couples to a mounting bracket disposed external to said shade tube and secured to a mounting surface.

In a further advantageous embodiment, said slip ring assembly is included in said mounting bracket adapted.

In a further advantageous embodiment, said slip ring assembly includes a fixed sleeve coupled to said battery support so that said fixed sleeve remains stationary during rotation of said shade tube, wherein said fixed sleeve is annular with a cylindrical outer surface and includes at least one first electrical contact extending annularly around said cylindrical outer surface.

In a further advantageous embodiment, said slip ring assembly includes a bearing sleeve rotatably carried on said fixed sleeve that couples to said interior side of said shade tube and rotates with said shade tube, wherein said bearing sleeve is annular with a cylindrical inner surface and includes at least one second electrical contact extending annularly along said cylindrical inner surface, and wherein said at least one second electrical contact maintains engagement with said at least one first electrical contact through an entire rotation of said shade tube.

In a further advantageous embodiment, a bracket is coupled to said fixed sleeve in a fixed arrangement, wherein said bracket is further coupled to said mounting bracket and includes a first flange; wherein said fixed sleeve includes a second flange; wherein said bearing sleeve is disposed between said first and second flanges to resist movement of said bearing sleeve along said central axis.

BRIEF DESCRIPTION OF THE DRAWINGS

The system designed to carry out the invention will hereinafter be described, together with other features thereof. The invention will be more readily understood from a reading of the following specification and by reference to the accompanying drawings forming a part thereof, wherein an example of the invention is shown and wherein:

FIG. 6A shows a partially exploded perspective view of a battery housing having a slip ring assembly in a window shade assembly according to the present invention;

FIG. 6B shows an exploded perspective view of a battery housing having a slip ring assembly according to the present invention;

Figure 1:
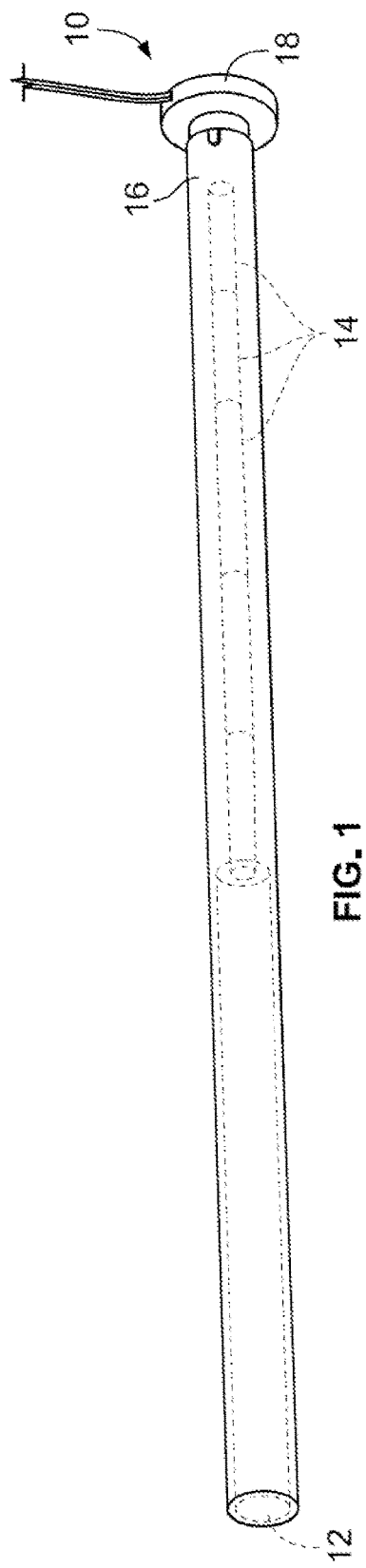
FIG. 1 shows a perspective view of a shade tube for a window shade assembly according to the present invention.

It will be understood by those skilled in the art that one or more aspects of this invention can meet certain objectives, while one or more other aspects can meet certain other objectives. Each objective may not apply equally, in all its respects, to every aspect of this invention. As such, the preceding objects can be viewed in the alternative with respect to any one aspect of this invention. These and other objects and features of the invention will become more fully apparent when the following detailed description is read in conjunction with the accompanying figures and examples. However, it is to be understood that both the foregoing summary of the invention and the following detailed description are of a preferred embodiment and not restrictive of the invention or other alternate embodiments of the invention. In particular, while the invention is described herein with reference to a number of specific embodiments, it will be appreciated that the description is illustrative of the invention and is not constructed as limiting of the invention. Various modifications and applications may occur to those who are skilled in the art, without departing from the spirit and the scope of the invention, as described by the appended claims. Likewise, other objects, features, benefits and advantages of the present invention will be apparent from this summary and certain embodiments described below, and will be readily apparent to those skilled in the art. Such objects, features, benefits and advantages will be apparent from the above in conjunction with the accompanying examples, figures and all reasonable inferences to be drawn therefrom, alone or with consideration of the references incorporated herein.

DETAILED DESCRIPTION OF A PREFERRED EMBODIMENT

With reference to the drawings, the invention will now be described in more detail. Unless defined otherwise, all technical and scientific terms used herein have the same meaning as commonly understood to one of ordinary skill in the art to which the presently disclosed subject matter belongs. Although any methods, devices, and materials similar or equivalent to those described herein can be used in the practice or testing of the presently disclosed subject matter, representative methods, devices, and materials are herein described.

Unless specifically stated, terms and phrases used in this document, and variations thereof, unless otherwise expressly stated, should be construed as open ended as opposed to limiting. Likewise, a group of items linked with the conjunction "and" should not be read as requiring that each and every one of those items be present in the grouping, but rather should be read as "and/or" unless expressly stated otherwise. Similarly, a group of items linked with the conjunction "or" should not be read as requiring mutual exclusivity among that group, but rather should also be read as "and/or" unless expressly stated otherwise.

References herein to the positions of elements (e.g., "top," "bottom," "above," "below," etc.) are merely used to describe the orientation of various elements in the FIGURES. It should be noted that the orientation of various elements may differ according to other exemplary embodiments, and that such variations are intended to be encompassed by the present disclosure.

Furthermore, although items, elements or components of the disclosure may be described or claimed in the singular, the plural is contemplated to be within the scope thereof unless limitation to the singular is explicitly stated. The presence of broadening words and phrases such as "one or more," "at least," "but not limited to" or other like phrases in some instances shall not be read to mean that the narrower case is intended or required in instances where such broadening phrases may be absent. For example, conjunctive language such as the phrase "at least one of X, Y, and Z," unless specifically stated otherwise, is understood to convey that an element may be either X, Y, Z; X and Y; X and Z; Y and Z; or X, Y, and Z (i.e., any combination of X, Y, and Z). Thus, such conjunctive language is not generally intended to imply that certain embodiments require at least one of X, at least one of Y, and at least one of Z to each be present, unless otherwise indicated.

It should be noted that the term "exemplary" and variations thereof, as used herein to describe various embodiments, are intended to indicate that such embodiments are possible examples, representations, and/or illustrations of possible embodiments (and such terms are not intended to connote that such embodiments are necessarily extraordinary or superlative examples).

The term "coupled," as used herein, means the joining of two members directly or indirectly to one another. Such joining may be stationary (e.g., permanent or fixed) or moveable (e.g., removable or releasable). Such joining may be achieved with the two members coupled directly to each other, with the two members coupled to each other using a separate intervening member and any additional intermediate members coupled with one another, or with the two members coupled to each other using an intervening member that is integrally formed as a single unitary body with one of the two members. Such members may be coupled mechanically, electrically, and/or fluidly.

Referring to FIG. 1, in one embodiment, a motor assembly 10 includes a motor 12 and a series of batteries 14 positioned within a tubular member 16. Tubular member 16 defines a shade tube constructed and arranged to carry a window shade which can be wrapped and unwrapped around tubular member 16. The motor assembly 10 is configured to be inserted into a shade tube to power the movement of a shade assembly. The tubular member 16 connects to a wall with a bracket 18. The batteries 14 are positioned end to end, which spaces the motor 12 away from the bracket 18, increasing the overall length of the motor assembly 10. In order for the motor assembly 10 to fit within the shade tube, the shade tube is longer than the motor assembly 10.

Figure 2:
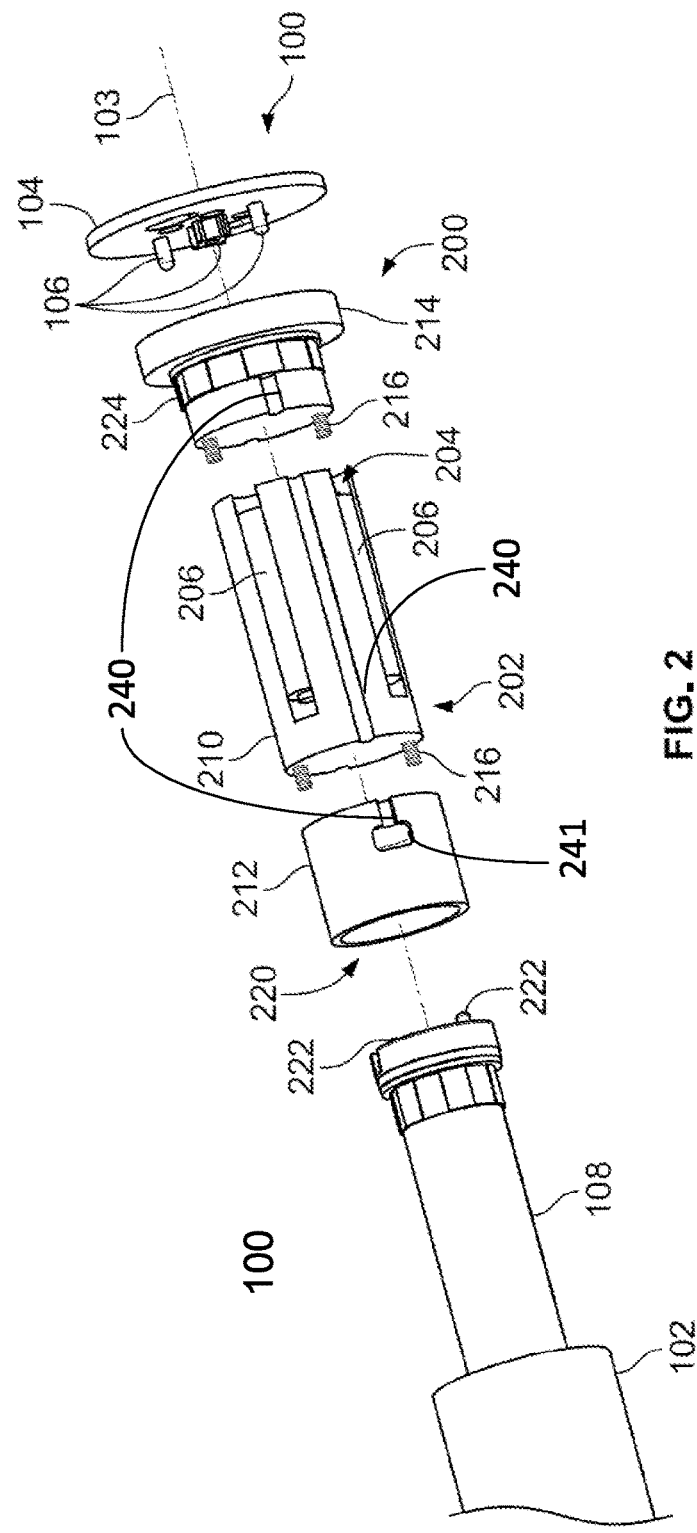
FIG. 2 shows an exploded view of a shade tube and battery housing for further embodiment of a window shade assembly according to the present invention.

Referring to FIG. 2, a shade assembly 100 is shown according to an exemplary embodiment. The shade assembly 100 includes a shade tube 102 around which shade material is configured to be rolled. The shade tube 102 extends longitudinally, and a central axis 103 extends longitudinally through the center of the shade tube 102. The shade assembly 100 further includes a mounting bracket 104 configured to be coupled (e.g., fastened, adhered) to a wall or other flat surface. A side of the mounting bracket 104 opposite the side facing the wall includes a series of protrusions or projections 106. A motor assembly, shown as motor 108, is coupled to the shade tube 102 and configured to rotate the shade tube 102 relative to the mounting bracket 104 about the central axis 103 to raise and lower the shade material. Operation of the motor 108 may be controlled by an onboard controller (e.g., the controller 350, FIG. 7). A user may issue commands (e.g., a desired motor speed, a desired direction of rotation) to the motor 108 and/or the controller through a wireless connection or a wired connection.

The shade assembly 100 further includes a stored energy assembly or battery pack 200, within the shade tube 102. The battery pack 200 includes a structural component or battery support, shown as battery housing 202, that couples the motor 108 to the mounting bracket 104. The mounting bracket 104, the motor 108, and the battery housing 202 are all centered about the central axis 103. The battery housing 202 defines a series of pockets, apertures, slots, or receivers, shown as battery bays 204. The battery bays 204 each receive at least one battery 206. The batteries 206 are configured to store energy and provide the stored energy as electrical energy (i.e., electricity) to power the motor 108. The batteries 206 may be rechargeable or disposable.

Figure 3:
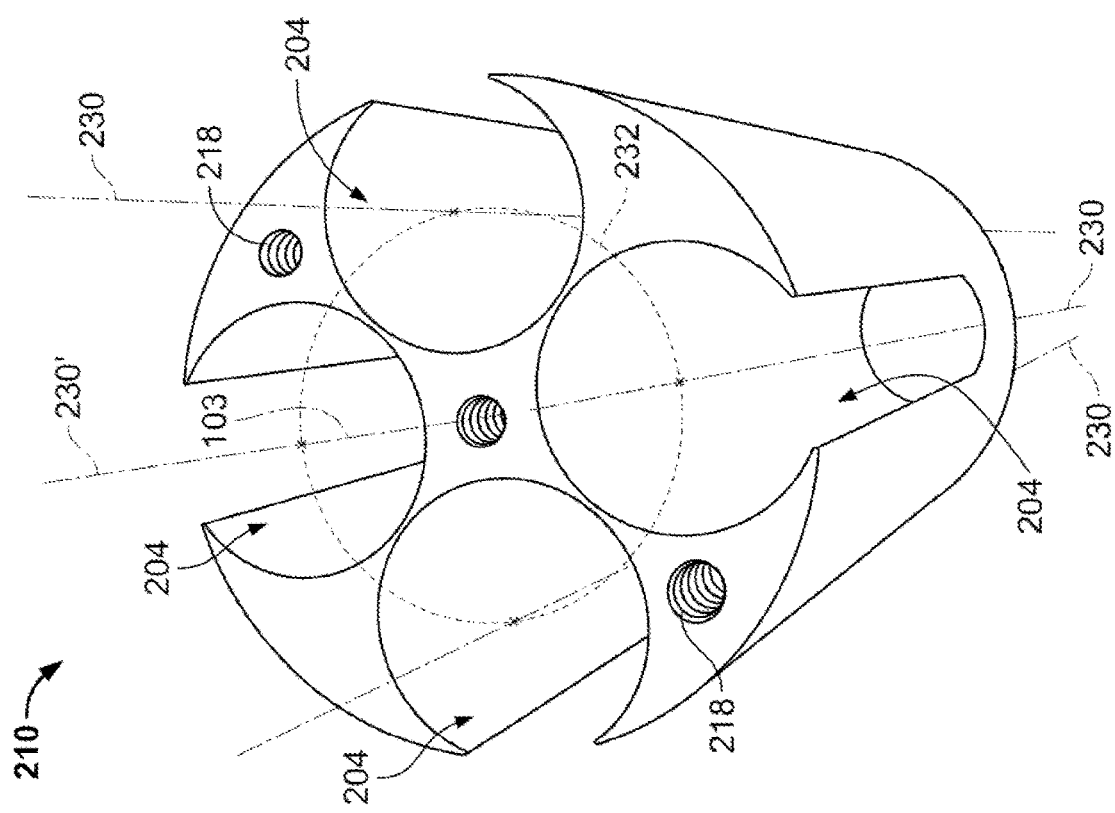
FIG. 3 shows a perspective view of a battery support of a window shade assembly according to the present invention.

Referring to FIG. 2, the battery housing 202 includes a first portion, shown as battery support 210, a second portion, shown as motor adapter 212, and a third portion, shown as mounting bracket adapter 214. The motor adapter 212 extends between the battery support 210 and the motor 108, and the mounting bracket adapter 214 extends between the mounting bracket 104 and the battery support 210. The battery support 210, the motor adapter 212, and the mounting bracket adapter 214 may be integrally formed or separable. As shown in FIG. 2, the battery support 210, the motor adapter 212, and the mounting bracket adapter 214 are selectively coupled to one another using fasteners 216. As shown in FIG. 3, the battery support 210 defines threaded apertures 218 that receive fasteners 216 from the mounting bracket adapter 214. As shown in FIG. 2, the battery bays 204 extend at least partway through the battery support 210, and the mounting bracket adapter 214 can be arrange to abut directly to the distal end of battery support 210 adjacent battery bays 204 to enclose the battery bays 204. The batteries 206 are contained within the battery bays 204. To remove the batteries 206 from the battery bays 204, the mounting bracket adapter 214 may be removed by disengaging the fasteners 216, and the batteries 206 may be slid longitudinally out of the battery bays 204. Alternatively, the battery bays 204 may extend into the motor adapter 212 and/or the mounting bracket adapter 214.

The motor adapter 212 is configured to couple the motor 108 to the battery support 210. The motor adapter defines a pocket, aperture, chamber, or receiver, shown as receiver 220, configured to receive an end of the motor 108. The motor 108 defines a pair of protrusions, shown as pins 222, offset from the central axis 103 and extending longitudinally towards the motor adapter 212. The pins 222 are received in corresponding apertures defined by the motor adapter 212, fixing against rotation the end of the motor 108 to the motor adapter 212. Alternatively, the pins 222 may be replaced with one or more fasteners extending laterally through both the motor 108 and the motor adapter 212. The battery housing 202 may include clips, fasteners, clamps, a threaded connection, or other components configured to prevent relative longitudinal movement between the end of the motor 108 and the motor adapter 212. The motor adapter 212 may be configured to couple to multiple different brands and types of motors.

The mounting bracket adapter 214 is configured to couple the battery support 210 to the mounting bracket 104. The mounting bracket adapter 214 defines pockets, apertures, chambers, or receivers configured to receive the projections 106 from the mounting bracket 104. The shapes of the apertures and the projections 106 may correspond, and/or the projections 106 may be offset from the central axis 103 such that the projections 106 prevent relative rotational movement between the motor adapter 212 and the mounting bracket adapter 214. The mounting bracket adapter 214 is shown as extending outside of the shade tube 102 such that the mounting bracket adapter 214 is visually exposed. Alternatively, the mounting bracket adapter 214 may be positioned entirely within the shade tube 102 such that the mounting bracket adapter 214 is obscured from view. The mounting bracket adapter 214 may be configured to couple to multiple different brands and types of mounting brackets. The mounting bracket adapter 214 includes an idler roller, shown as crown roller 224, that is configured to rotate freely relative to the mounting bracket and the battery support 210. The crown roller 224 engages an interior surface of the shade tube 102 to rotatably support the weight of the shade tube 102. The crown roller 224 may be splined to key to the inner surface of the shade tube 102. A spacer 223 may be included in the mounting bracket adapter 314 for engaging a distal end of battery support 210.

When the motor 108 exerts a torque on the shade tube 102, the battery housing 202 transfers the torque to the mounting bracket 104 such that the shade tube 102 rotates relative to the mounting bracket 104. Specifically, the motor 108 transfers the torque to the motor adapter 212 through the pins 222. The motor adapter 212 transfers the torque to the battery support 210 through the fasteners 216. The battery support 210 transfers the torque to the mounting bracket adapter 214 through the fasteners 216. The mounting bracket adapter 214 transfers the torque to the mounting bracket 104 through the projections 106.

Figure 4:
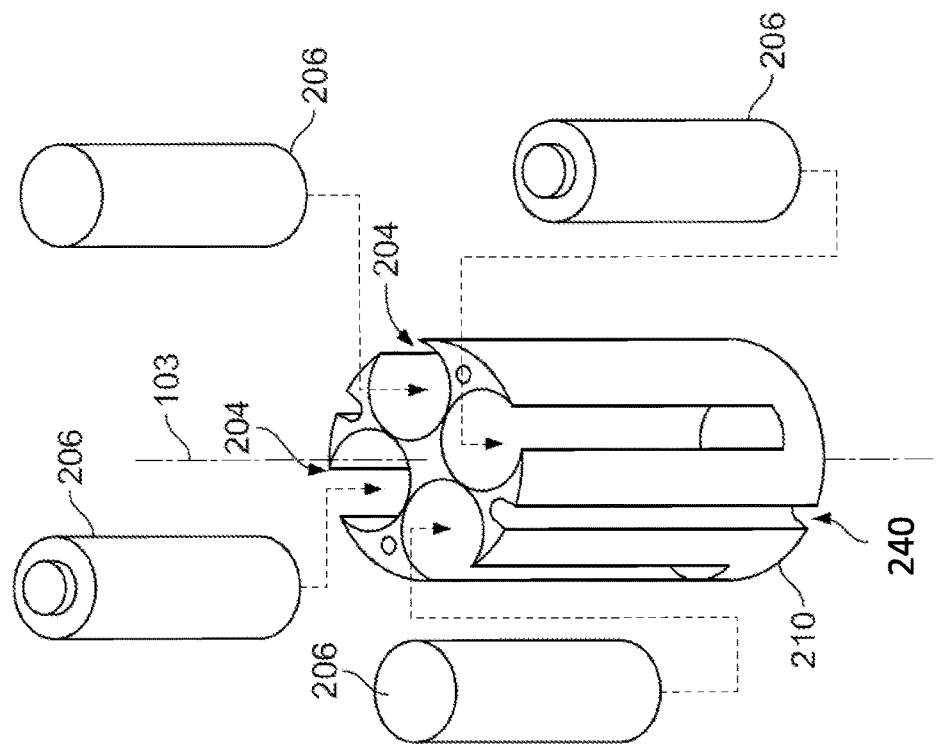
FIG. 4 shows an exploded perspective of a battery support and batteries of a window shade assembly according to the present invention.

Referring to FIGS. 3 and 4, the battery bays 204 are distributed radially around the central axis 103. The battery bays 204 extend longitudinally such that the batteries 206 and the battery bays 204 are offset radially from the central axis 103. The battery bays 204 are cylindrical and are positioned to extend laterally through a circumference of the battery support 210. The battery bays 204 are positioned in a circular pattern such that a central axis 230, 230' of each battery bay 204 extends through a circle 232 centered about the central axis 103. The battery support 210 defines four battery bays 204, each containing a single battery 206. Alternatively, each battery bay 204 may contain multiple batteries 206 arranged end-to-end. The batteries 206 are shaped and sized to correspond to the battery bays 204 (e.g., cylindrical). Accordingly, a central axis of each battery 206 aligns with the central axis 230 of the corresponding battery bay 204. Each of the battery bays 204 are located at the same longitudinal location. This allows the batteries 206 to overlap longitudinally (e.g., at least two batteries 206 extend through a single longitudinal position). Accordingly, more batteries 206 can be positioned in a shorter longitudinal space, reducing the distance from the mounting bracket 104 to the opposing end of the motor 108. This allows the shade assembly 100 to be used with narrower windows.

In other embodiments, the battery bays 204 are each positioned at different radial distances from the central axis 230. The quantity and size of the battery bays 204 and the batteries 206 may be varied. By way of example, the battery support 210 may define a single battery bay 204 that contains one or more batteries 206. The battery bays 204 may be positioned inward such that the battery bays 204 do not extend laterally through the circumference of the battery support 210. The battery bays 204 may have various shapes (e.g., square, triangular, pie-wedge-shaped, etc.). A battery bay 204 may be configured to house multiple batteries 206 at the same longitudinal position. By way of example, a battery bay 204 may extend circumferentially along the battery support 210 through an angle of approximately 160 degrees such that two batteries 206 fit within the battery bay 204.

Referring again to FIG. 2, the battery housing 202 further defines a slot, shown as wire slot 240, that extends through the battery support 210, the motor adapter 212, and the mounting bracket adapter 214. The wire slot 240 extends between the battery bays 204 and the receiver 220 into a wire port 241 in receiver 220. One or more cables or wires pass through the wire slot 240, electrically coupling the batteries 206 to the motor 108. The wire slot 240 may additionally facilitate an antenna of the controller passing through the battery pack 200 to extend outside of the shade tube 102, thereby improving the wireless reception of the antenna.

In some embodiments, the battery pack 200 can be removed from the shade assembly 100 in order to recharge or replace the battery pack 200. To remove the battery pack 200, the battery pack 200 may be pulled away from the mounting bracket 104. The battery pack 200 may be pulled out of the shade tube 102, and subsequently fasteners may be removed to decouple the battery pack from the motor 108. To replace the battery pack 200, a reverse process may be followed. The battery pack 200 may be replaced with another battery pack 200 having charged batteries 206. Alternatively, the mounting bracket adapter 214 may be removed from the battery support 210, and the batteries 206 may be removed from the battery bays 204 and recharged or replaced.

Figure 5:
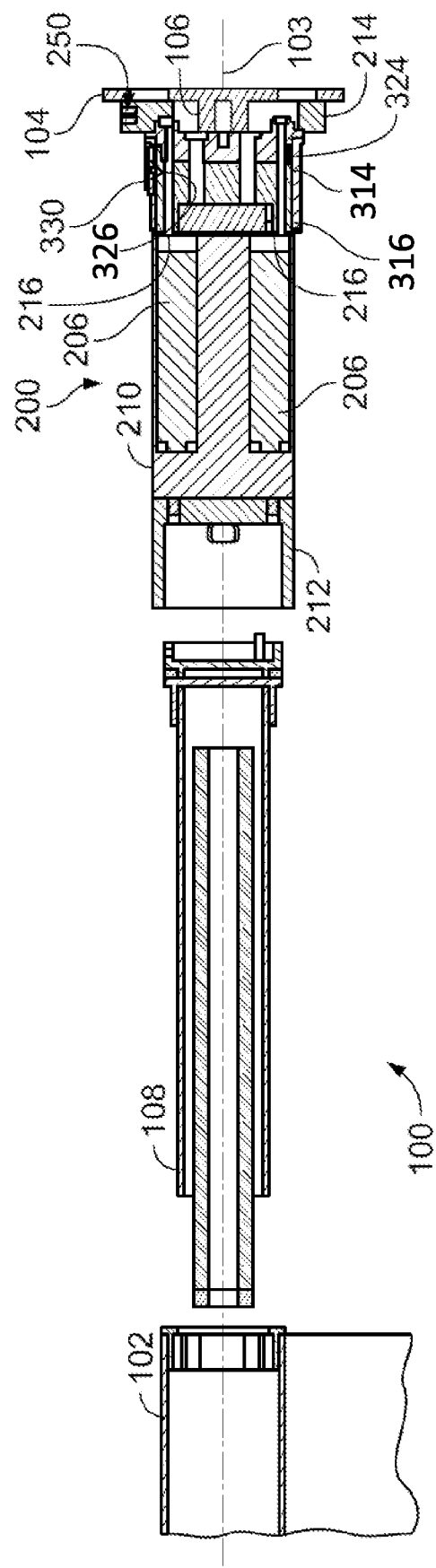
FIG. 5 shows a cross-section of a battery housing of a window shade assembly according to the present invention.

Alternatively, the batteries 206 may be recharged without disassembling the shade assembly 100. As shown in one embodiment of the invention in FIG. 5, the mounting bracket adapter 214 defines a charging port 250 that is configured to interface with a charging cord of an external power supply. The charging port 250 is electrically coupled to the batteries 206 such that electrical power can be supplied from the external power supply through the charging port 250 to charge the batteries 206.

FIGS. 6A and 6B illustrate a further embodiment of the shade assembly 100. In the embodiment illustrated in FIG. 6A, a shade 300 is coupled to the shade tube 102. The shade 300 extends longitudinally along the shade tube 102 and has a length that can be selectively wrapped around the shade tube 102. One end of the shade 300 is coupled to the shade tube 102. Specifically, the shade tube 102 defines a groove 302 that receives the end of the shade 300. The shade assembly 100 may include one or more fasteners (e.g., a strip of plastic for rubber pressed into the groove 302, etc.) that prevent the shade 300 from exiting the groove 302.

The shade 300 includes a material (e.g., sheet, film, etc.) shown as base material 304, and one or more devices (e.g., solar collection units, solar films, photovoltaic arrays or elements, solar panels, etc.), shown as solar membrane 306. The base material 304 may be a shade material that at least partially obstructs the passage of light therethrough. The base material 304 is flexible such that the base material 304 may be rolled and unrolled onto and off of the shade tube 102. The solar membrane 306 is structurally coupled to the base material 304 and functions to receive (e.g., collect, harvest, etc.) light energy (e.g., photons) from a source, such as the sun. The solar membrane 306 may be integrated with the base material 304 (e.g., placed between layers of base material 304) or coupled to (e.g., attached to, adhered to, etc.) the base material 304. The solar membrane 306 may extend across a portion of or the entirety of the length of the shade 300. The solar membrane 306 converts light energy into electrical energy. The electrical energy can then be used to drive the motor 108, stored in the batteries 206, or provided to a surrounding power grid (e.g., the power grid 360, which may be a home power grid, a residential power grid, etc.).

Referring to FIGS. 6A and 6B, the battery housing 202 of the shade assembly 100 includes a slip ring assembly 310 in place of the crown roller 224 (FIG. 2). The slip ring assembly 310 is configured to transfer electrical energy from the solar membrane 306 into the shade tube 102 while still facilitating free rotation of the shade tube 102. The slip ring assembly 310 includes a bracket 312, a first bearing portion, shown as fixed sleeve 314, and a second bearing portion, shown as bearing sleeve 316, and a spacer 318. The bracket 312 couples to the mounting bracket adapter 214, the fixed sleeve 314 couples to the bracket 312, and the spacer 318 couples to the fixed sleeve 314 and the battery support 210. Specifically, the mounting bracket adapter 214, the bracket 312, the fixed sleeve 314, and the spacer 318 each include fasteners 216 that engage corresponding threaded apertures 218 in the bracket 312, the fixed sleeve 314, the spacer 318, and the battery support 210, respectively. The mounting bracket adapter 214, the bracket 312, the fixed sleeve 314, the bearing sleeve 316, and the battery support 210 are each centered about the central axis 103. The spacer 318 may be included and defines a portion of the wire slot 240. The bracket 312 and the fixed sleeve 314 each define a passage to facilitate passage of wires or other components therethrough. By way of example, a wire may extend from the wall through the mounting bracket 104, the mounting bracket adapter 214, the bracket 312, and the fixed sleeve 314 and into the wire slot 240 defined in part by the spacer 318.

The bearing sleeve 316 is annular and extends around the fixed sleeve 314. The fixed sleeve 314 defines a cylindrical outer surface 320, and the bearing sleeve 316 defines a cylindrical inner surface 322. The cylindrical outer surface 320 and the cylindrical inner surface 322 are approximately the same diameter and engage one another. Accordingly, the bearing sleeve 316 rotates freely about the fixed sleeve 314. The bearing sleeve 316 and/or the fixed sleeve 314 may be made from a material that reduces friction (e.g., bronze, hard plastic, etc.) or include bearing elements such as ball or needle bearings to facilitate such rotation. The fixed sleeve 314 and the bracket 312 each define a flange 317a and 317b, respectively extending radially outward. The bearing sleeve 316 is positioned between the flanges such that the flanges limit or entirely prevent axial movement of the bearing sleeve 316.

The fixed sleeve 314 defines a first set of contacts, shown as annular contacts 324, along the cylindrical outer surface 320. The bearing sleeve 316 defines a second set of contacts, shown as pickups 326, carried along the cylindrical surface, which extend from an exterior side 322a to and interior side 322b. The annular contacts 324 and the pickups 326 are configured such that each pickup 326 engages a corresponding one of the annular contacts 324 in all orientations of the bearing sleeve 316 (e.g., maintaining engagement through an entire rotation of the bearing sleeve 316). In other embodiments, the bearing sleeve 316 includes annular contacts and/or the fixed sleeve 314 includes pickups.

The annular contacts 324 and the pickups 326 are all electrically conductive. The annular contacts 324 are stationary (e.g., fixed relative to the mounting bracket 104 when the shade assembly 100 is installed). The annular contacts 324 rotate with the bearing sleeve 316, which in turn rotates with the shade tube 102. The annular contacts 324 are electrically coupled to one or more components configured to receive electrical energy. These components may be positioned within the shade tube 102 (e.g., the batteries 206, the motor 108, etc.) or the components may be positioned outside the shade tube 102 and electrically coupled to the annular contacts 324 through conductors (e.g., wires, cables, etc.) that extend inside of the shade tube 102 (e.g., the power grid 360, the charging port 250, etc.). The pickups 326 are each electrically coupled to the solar membrane 306 through a conductor or cable, shown as wire 328. The pickups 326 extend radially outward through the bearing sleeve 316 to engage the wires 328. The wires 328 are coupled to an outer surface of the bearing sleeve 316 through a grommet or base plate, shown as wire mount 330.

Referring to FIG. 6A, a bushing, shown as shade tube bushing 340, is annular in shape and receives the bearing sleeve 316. The shade tube bushing 340 is received within the shade tube 102. Accordingly, the shade tube bushing 340 extends directly between and couples the bearing sleeve 316 and the shade tube 102. The shade tube bushing 340 is sized to prevent relative radial movement between the bearing sleeve 316 and the shade tube 102. Accordingly, the slip ring assembly 310 partially supports the weight of the shade tube 102 and the shade 300. The shade tube bushing 340 defines a first cutout, shown as slot 342, and the shade tube 102 defines a second cutout, shown as notch 344. When assembled, the slot 342 and the notch 344 (best shown in FIG. 8) receive the wire mount 330. The shade tube 102, the shade tube bushing 340, and the bearing sleeve 316 are all coupled to one another and rotate together.

Figure 7:
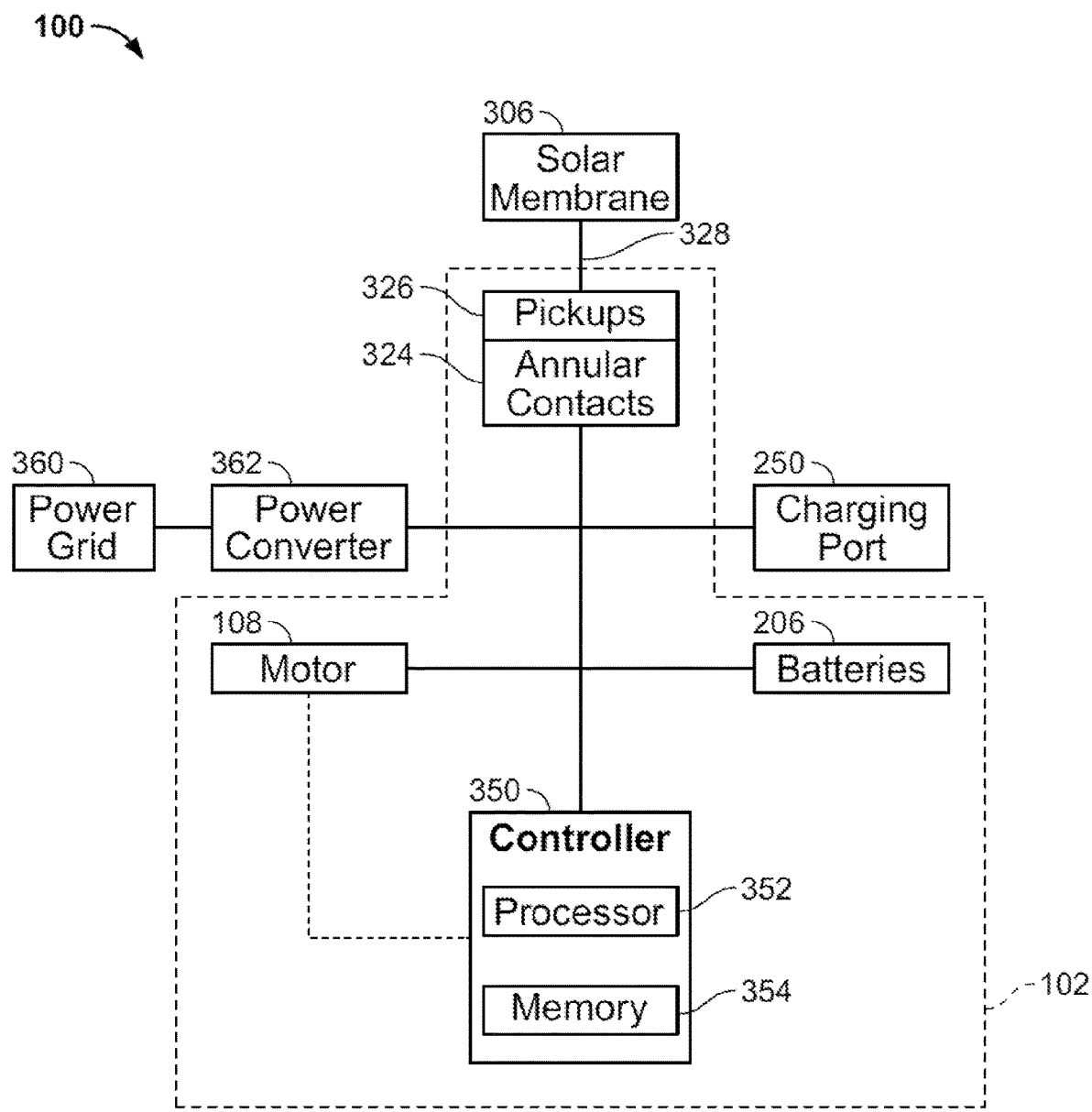
FIG. 7 shows a block diagram illustrating electrical connections of a window shade assembly according to the present invention.

Referring to FIG. 7, the motor 108 is operatively coupled to a controller 350. Operation of the motor 108, and thereby raising and lowering of the shade 300, is controlled by the controller 350. According to the exemplary embodiment shown in FIG. 7, the controller 350 includes a processing circuit, shown as processor 352, and a memory device, shown as memory 354. In some embodiments, the controller 350 represents a collection of processing devices. In such cases, the processor 352 represents the collective processors of the devices, and the memory 354 represents the collective storage devices of the devices.

FIG. 7 illustrates an exemplary electrical connection arrangement of the shade assembly 100. It should be noted that in other embodiments, the shade assembly 100 may include only two or more of the components shown in FIG. 7. When the solar membrane 306 is exposed to light, the solar membrane 306 provides electrical energy to the pickups 326 through the wires 328. The pickups 326 engage the annular contacts 324, thereby providing the electrical energy to the annular contacts 324. Because of the continuous engagement of the pickups 326 and the annular contacts 324, the solar membrane 306 is continuously electrically coupled to the annular contacts 324, even when the shade tube 102 is rotating. As shown, the motor 108, the batteries 206, the charging port 250, and the controller 350 are electrically coupled to the annular contacts 324 through a bus. An electrical grid, shown as power grid 360, is also electrically coupled to the annular contacts 324 through a power converter 362 and the bus. In other embodiments, other electrical connection arrangements are used with the shade assembly 100. As shown, the motor 108, the batteries 206, the annular contacts 324, the pickups 236, and the controller 350 are located within the shade tube 102 such that the shade tube 102 at least partially obscures those components from view. In other embodiments, the power converter 362 or the charging port 250 are located within the shade tube 102 as well.

The electrical energy from the solar membrane 306 is provided to one or more components. The electrical energy can be used to power the motor 108. The electrical energy can be stored in the batteries 206 for later use. The electrical energy can be used to power the controller 350. The electrical energy can be provided to the power grid 360. By way of example, a high-rise office building may include a shade assembly 100 in each window. The electrical energy produced by the shade assemblies 100 may be used to power various functions associated with the building or other structures coupled to the power grid 360 (e.g., powering lights, powering HVAC systems, etc.). In the embodiment shown in FIG. 7, electrical energy passes through the power converter 362 prior to entering the power grid 360 to convert from DC to AC power, to change the voltage of the electrical energy, or to otherwise convert or condition the electrical energy for use on the power grid 360. The power converter 362 may include voltage regulators, power inverters, rectifiers, transformers, or other types of power conditioning or power conversion components. In some embodiments, electrical energy can also flow into the shade assembly 100 through the power grid 360 or the charging port 250 to power the motor 108 or controller 350 or to charge the batteries 206.

In some embodiments, the controller 350 is configured to automatically raise or lower the shade 300 (e.g., by powering the motor 108 to turn the shade tube 102) in response to certain conditions. In one such embodiment, the controller 350 is configured to monitor a charge level of the batteries 206 (e.g., by measuring an output voltage of the batteries 206, etc.). In response to the charge level falling below a first threshold level (e.g., a threshold voltage, etc.), the controller 350 is configured to control the motor 108 to lower the shade 300. Lowering the shade 300 exposes a greater area of the solar membrane 306 to light. Accordingly, with the shade 300 lowered, the solar membrane 306 produces a greater amount of electrical energy (e.g., a greater wattage), and accordingly charges the batteries 206. The controller 350 may be configured to subsequently raise the shade 300 when the charge level exceeds a second charge level greater than the first charge level. The first charge level and the second charge level may be predetermined and stored in the memory 354. In such a configuration, the controller 350 automatically maintains the charge level the batteries 206 within a usable range, thereby preventing the batteries 206 from draining to a charge level where the user would have to manually charge the batteries 206 (e.g., by supplying electrical energy through the charging port 250, etc.).

Figure 8:
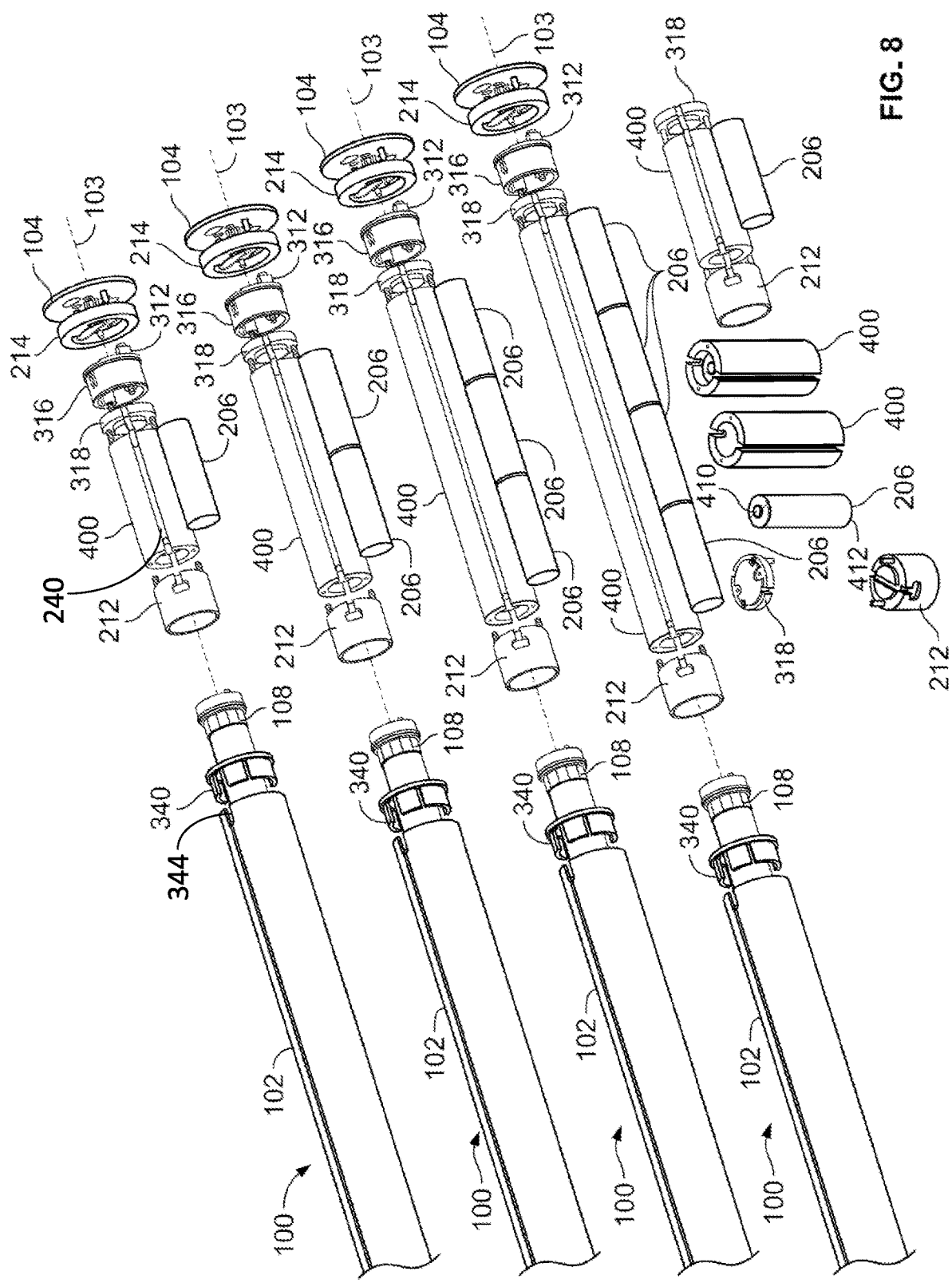
FIG. 8 shows an exploded perspective view of a series of battery arrangements for a window shade assembly according to the present invention.

FIG. 8 illustrate further embodiments of the shade assembly 100. The embodiments shown in FIGS. FIG. 8 are substantially similar to the embodiment of the shade assembly 100 shown in FIGS. 6A and 6B except that the battery support 210 is replaced with a structural component, shown as battery support 400. The battery support 400 is coupled to the motor adapter 212 and the spacer 318, similar to the battery support 210. However, instead of including multiple battery bays 204, the battery support 400 defines a single pocket, aperture, or receiver, shown as battery bay 402.

The battery bay 402 is centered about the central axis 103 and extends through the entire length of the battery support 400. The battery bay 402 is configured to receive one or more batteries 206. The battery bay 402 has a circular cross section. The battery bay 402 is sized to substantially prevent movement of the batteries 206 except rotation and translation of the batteries 206 about the central axis 103. Accordingly, when one or more of the batteries 206 are inserted into the battery bay 402, the batteries 206 are centered about the central axis 103.

The battery support 400 further defines a slot, shown as wire slot 240, that extends through the entire length of the battery support 400. The wire slot 240 in battery support 400 aligns with a portion of the wire slot 240 defined by the motor adapter 212 and the spacer 318. One or more cables or wires pass through the wire slot 240, electrically coupling the batteries 206, the motor 108, and/or the wires 328. One or more antennas may additionally pass through the wire slot 240.

FIG. 8 illustrate four different battery supports 400, each having a different length. The lengths of each battery support 400 correspond to the number of batteries 206 able to be contained within the battery bay 402 of the battery support 400. By way of example, the uppermost battery support 400 is configured to contain one battery 206. The battery supports 400 below it are configured to contain two, three, and four batteries 206 respectively. The length of the wire slot 240 and the distance between the mounting bracket 104 and the motor 108 are dependent on the length of the battery support 400.

In each of the embodiments shown in FIG. 8, the batteries 206 are arranged inline along the central axis 103. Each battery 206 includes a first conductive portion (e.g., a contact, a terminal, etc.), shown as positive terminal 410, and a second conductive portion (e.g., a contact, a terminal, etc.), shown as negative terminal 412. In some embodiments, the positive terminal 410 of one battery 206 engages the negative terminal 412 of an adjacent battery 206. This pattern is repeated for each of the batteries 206, such that all of the batteries 206 are in series. A pair of contacts may then engage the positive terminal 410 and the negative terminal 412 that are not engaged by other batteries 206 (e.g., the terminals at the ends of the battery arrangement) to complete the circuit. In other embodiments, the batteries 206 are otherwise arranged. By way of example, a set of contacts may engage each battery 206 individually.

The hardware and data processing components used to implement the various processes, operations, illustrative logics, logical blocks, modules and circuits described in connection with the embodiments disclosed herein may be implemented or performed with a general purpose single- or multi-chip processor, a digital signal processor (DSP), an application specific integrated circuit (ASIC), a field programmable gate array (FPGA), or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some embodiments, particular processes and methods may be performed by circuitry that is specific to a given function. The memory (e.g., memory, memory unit, storage device, etc.) may include one or more devices (e.g., RAM, ROM, Flash memory, hard disk storage, etc.) for storing data and/or computer code for completing or facilitating the various processes, layers and modules described in the present disclosure. The memory may be or include volatile memory or non-volatile memory, and may include database components, object code components, script components, or any other type of information structure for supporting the various activities and information structures described in the present disclosure. According to an exemplary embodiment, the memory is communicably connected to the processor via a processing circuit and includes computer code for executing (e.g., by the processing circuit and/or the processor) the one or more processes described herein.

While the present subject matter has been described in detail with respect to specific exemplary embodiments and methods thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art using the teachings disclosed herein.

What is claimed is:

1. A window shade assembly, comprising:
a shade tube configured to support a shade and extending longitudinally, wherein a central axis extends longitudinally through the center of said shade tube;
a mounting bracket;
a motor assembly extending within said shade tube, coupled to said shade tube, and configured to rotate said shade tube relative to said mounting bracket about said central axis to at least one of raise and lower said shade; and
a battery pack extending within said shade tube, the battery pack comprising:
a battery housing coupling said motor assembly with said mounting bracket, and wherein said battery housing including at least one battery bay; and
at least one battery carried within said at least one battery bay, wherein said at least one battery is configured to store energy, and wherein said at least one battery is configured to provide the energy to said motor assembly to power said motor assembly for rotating said shade tube to raise and lower said shade;
a slip ring assembly included in said battery housing, wherein said slip ring assembly couples with an interior surface of said shade tube for rotating with said shade tube, wherein said shade includes a photovoltaic element configured to generate electrical energy in response to receiving light, and wherein said slip ring assembly provides an electrical coupling from said photovoltaic element to said at least one battery in said battery housing while rotating with said shade tube;
wherein said slip ring assembly includes a fixed sleeve carried in a fixed position in said battery housing so that said fixed sleeve remains stationary during rotation of said shade tube, wherein said fixed sleeve is annular with a cylindrical outer surface and includes at least one first electrical contact extending annularly around said cylindrical outer surface.

2. The window shade assembly of claim 1, wherein said at least one battery bay is centered and extends longitudinally along said central axis within said shade tube.

3. The window shade assembly of claim 1, wherein said at least one battery bay includes a series of batteries arranged inline longitudinally end to end in a single row centered along said central axis such that the positive terminal of one battery engages the negative terminal of an adjacent battery.

4. The window shade assembly of claim 1, wherein said at least one battery bay is offset from said central axis within said shade tube.

5. The window shade assembly of claim 4, wherein said battery housing includes a plurality of battery bays arrayed around said central axis of said shade tube and extending longitudinally parallel to said central axis for receiving said at least one battery in each of said battery bays.

6. The window shade assembly of claim 5, wherein said plurality of battery bays have a circular cross-section transverse to said central axis.

7. The window shade assembly of claim 5, wherein said plurality of battery bays are positioned in a circular pattern such that a central axis of each battery bay is located along a common circle concentric to said central axis of said shade tube.

8. The window shade assembly of claim 5, wherein said plurality of battery bays are arranged in opposing laterally offset locations around said central axis of said shade tube so that said battery bays extend longitudinally along the same portion of length within said shade tube.

9. The window shade assembly of claim 1, wherein said battery housing includes a first portion defining a battery support, wherein said at least one battery bay is included in at least said battery support.

10. The window shade assembly of claim 9, wherein said battery housing includes a second portion defining a motor adaptor, wherein said motor adaptor is coupled to a first end of said battery support and engages said motor assembly.

11. The window shade assembly of claim 10, wherein said motor adaptor includes a cavity defining a receiver that receives an end portion of said motor assembly in a fixed arrangement so that said end portion torques against said motor adaptor to facilitate rotation of said shade tube by said motor assembly, and wherein said motor adaptor remains stationary during rotation of said shade tube.

12. The window shade assembly of claim 10, wherein said battery housing includes a third portion defining a mounting bracket adapter, wherein said mounting bracket adapter is coupled to a second end of said battery support opposite from said motor adapter and engages said mounting bracket.

13. The window shade assembly of claim 12, wherein said mounting bracket adapter includes at least one recess receiving at least one complementary projection from said mounting bracket to resist rotation between said mounting bracket adapter and said mounting bracket, wherein said battery housing remains stationary within said shade tube when said motor assembly is rotating said shade tube.

14. The window shade assembly of claim 12, wherein said mounting bracket adapter is releasably coupled to said second end of said battery support, and said at least one battery bay extends to said mounting bracket adapter such that removal of said mounting bracket adapter from said battery support provides access to said at least one battery bay to insert and remove said at least one battery disposed in said at least one battery bay.

15. The window shade assembly of claim 12, including a charge port disposed in said mounting bracket adapter configured to interface with a charging cord of an external power supply, wherein said charge port is electrically coupled to said at least one battery such that electrical power is supplied from said external power supply through said charging port to charge said at least one battery.

16. The window shade assembly of claim 12, including a wire slot is disposed in at least one of said battery support, said motor adapter and said mounting bracket adapter for channeling wiring to electrically connect said at least one battery to said motor assembly.

17. The window shade assembly of claim 16, wherein said wire slot extends from said mounting bracket adapter along said battery support and said motor adapter to a wire port disposed in said motor adapter for channeling wiring to electrically connect said at least one battery to said motor assembly.

18. A window shade assembly, comprising:
- a shade tube configured to support a shade and extending longitudinally, wherein a central axis extends longitudinally through the center of said shade tube;
- a photovoltaic element disposed on said shade configured to generate electrical energy in response to receiving light;
- a mounting bracket for supporting said shade tube on a mounting surface;
- a motor assembly extending within said shade tube, coupled to said shade tube, and configured to rotate said shade tube about said central axis to at least one of raise and lower said shade; and
- a battery housing coupling said motor assembly with said mounting bracket so that said battery housing is stationary within said shade tube during rotation of said shade tube;
- at least one battery bay disposed in said battery housing carrying at least one battery, wherein said at least one battery is electrically coupled to said motor assembly; and,
- a slip ring assembly included in said battery housing, wherein said slip ring assembly couples with an interior side of said shade tube for rotating with said shade tube, and wherein said slip ring assembly provides an electrical coupling from said photovoltaic element to said at least one battery in said battery housing while rotating with said shade tube;
- wherein said slip ring assembly includes a fixed sleeve carried in a fixed position in said battery housing so that said fixed sleeve remains stationary during rotation of said shade tube, wherein said fixed sleeve is annular with a cylindrical outer surface and includes at least one first electrical contact extending annularly around said cylindrical outer surface.

19. The window shade assembly of claim 18, wherein said slip ring assembly includes a bearing sleeve rotatably carried on said fixed sleeve that couples to said interior side of said shade tube and rotates with said shade tube, wherein said bearing sleeve is annular with a cylindrical inner surface and includes at least one second electrical contact extending annularly along said cylindrical inner surface, and wherein said at least one second electrical contact maintains engagement with said at least one first electrical contact through an entire rotation of said shade tube.

20. The window shade assembly of claim 19, wherein said at least one first electrical contact is electrically coupled to at least one of said motor assembly and said at least one battery.

21. The window shade assembly of claim 19, wherein said at least one second electrical contact is electrically coupled to said photovoltaic element.

22. The window shade assembly of claim 19, including an annular bushing receiving said bearing sleeve, wherein said annular bushing engages said interior surface of shade tube and an exterior surface of said bearing sleeve to resist radial movement of said bearing sleeve within said shade tube.

23. The window shade assembly of claim 19, including a bracket coupled to said fixed sleeve in a fixed arrangement, wherein said bracket includes a first flange and said fixed sleeve includes a second flange; wherein said bearing sleeve is disposed between said first and second flanges to resist movement of said bearing sleeve along said central axis.

24. The window shade assembly of claim 18, including a controller electrically coupled to said motor assembly, said at least one battery, and said photovoltaic element; wherein said controller is configurable to monitor a charge level of said at least one battery and to power said motor assembly to automatically lower said shade in response to said charge level falling below a threshold level, and to power said motor assembly to automatically raise said shade in response to said charge level exceeding said threshold level.

25. A window shade assembly, comprising:
- a shade tube configured to support a shade and extending longitudinally, wherein a central axis extends longitudinally through the center of said shade tube;
- a motor assembly extending within said shade tube, coupled to said shade tube, and configured to rotate said shade tube about said central axis to at least one of raise and lower said shade;
- a battery housing coupled to said motor assembly so that said battery housing is stationary within said shade tube during rotation of said shade tube;
- at least one battery bay disposed in said battery housing carrying at least one battery, wherein said at least one battery is electrically coupled to said motor assembly; and,
- a slip ring assembly rotatably coupling said shade tube to said battery housing so that said shade tube rotates around said battery housing, wherein said slip ring assembly provides an electrical coupling from a power source to at least one of said motor assembly and said at least one battery;
- wherein said battery housing includes a first portion defining a battery support, wherein said at least one battery bay is included in at least said battery support;
- wherein said battery housing includes a second portion defining a motor adapter, wherein said motor adaptor is coupled to a first end of said battery support and engages said motor assembly;
- wherein said battery housing includes a third portion defining a mounting bracket adapter, wherein said mounting bracket adapter is coupled to a second end of said battery support opposite from said motor adapter and further couples to a mounting bracket disposed external to said shade tube and secured to a mounting surface;
- wherein said slip ring assembly is included in said mounting bracket adapter;
- wherein said slip ring assembly includes a fixed sleeve coupled to said battery support so that said fixed sleeve remains stationary during rotation of said shade tube, wherein said fixed sleeve is annular with a cylindrical outer surface and includes at least one first electrical contact extending annularly around said cylindrical outer surface.

26. The window shade assembly of claim 25, wherein said power source comprises a photovoltaic element disposed on said shade configured to generate electrical energy in response to receiving light.

27. The window shade assembly of claim 25, wherein said battery housing is coupled in a fixed arrangement to a mounting bracket disposed external to said shade tube, wherein said mounting bracket is secured to a mounting surface so that said battery housing is fixed in a stationary arrangement within said shade tube and said motor assembly torques against said battery housing for rotating said shade tube.

28. The window shade assembly of claim 25, wherein said slip ring assembly includes a bearing sleeve rotatably carried on said fixed sleeve that couples to said interior side of said shade tube and rotates with said shade tube, wherein said bearing sleeve is annular with a cylindrical inner surface and includes at least one second electrical contact extending annularly along said cylindrical inner surface, and wherein said at least one second electrical contact maintains engagement with said at least one first electrical contact through an entire rotation of said shade tube.

29. The window shade assembly of claim 28, including a bracket coupled to said fixed sleeve in a fixed arrangement, wherein said bracket is further coupled to said mounting bracket and includes a first flange; wherein said fixed sleeve includes a second flange; wherein said bearing sleeve is disposed between said first and second flanges to resist movement of said bearing sleeve along said central axis.

* * * * *